United States Patent [19]
Imondi et al.

[11] Patent Number: 5,457,771
[45] Date of Patent: Oct. 10, 1995

[54] INTEGRATED CIRCUIT WITH NON-VOLATILE, VARIABLE RESISTOR, FOR USE IN NEURONIC NETWORK

[75] Inventors: Giuliano Imondi, Benucci; Giulio Marotta, Rieti; Eros Pasero, Turin; Giulio Porrovecchio, Rieti; Giuseppe Savarese, Napoli, all of Italy

[73] Assignee: Texas Instruments Incorporated, Dallas, Tex.

[21] Appl. No.: 762,817

[22] Filed: Sep. 18, 1991

[30] Foreign Application Priority Data

Sep. 20, 1990 [IT] Italy ................. 48293/90

[51] Int. Cl.$^6$ ................. H01L 29/86
[52] U.S. Cl. ................. 395/23; 365/185.05
[58] Field of Search ................. 307/450, 201; 365/45, 185; 395/23

[56] References Cited

U.S. PATENT DOCUMENTS

| | | | |
|---|---|---|---|
| 4,782,460 | 11/1988 | Spencer | 307/201 |
| 4,935,648 | 6/1990 | Radiy et al. | 307/450 |
| 5,021,693 | 6/1991 | Shima | 307/201 |
| 5,055,897 | 10/1991 | Canepa et al. | 307/201 |
| 5,065,132 | 11/1991 | Taddiken et al. | 307/201 |

OTHER PUBLICATIONS

Scott, Donald E.; "An Introduction to Circuit Analysis"; ©1987 by McGraw–Hill, Inc.; pp. 316, 320–321.

*Primary Examiner*—Edward P. Westin
*Assistant Examiner*—Benjamin O. Driscoll
*Attorney, Agent, or Firm*—William E. Hiller; Richard L. Donaldson

[57] ABSTRACT

Integrated circuit with a non-volatile variable resistor which is particularly adapted for use in a neuronic network. The integrated circuit comprises a symmetrically replicated structure including a floating gate MOS transistor (TRP; TRN) and an EEPROM memory cell based upon N-channel MOS transistors and including a read-out MOS transistor (TSP; TSN) and a tunnel-effect charge injection MOS element (TUNP; TUNN), with floating gates. The floating gates of all transistors and of the tunnel-effect element are connected together, with the ends of the resistor (R1P, R2P; R1N, R2N) being taken out from the source and drain regions of the floating gate MOS transistor.

10 Claims, 1 Drawing Sheet

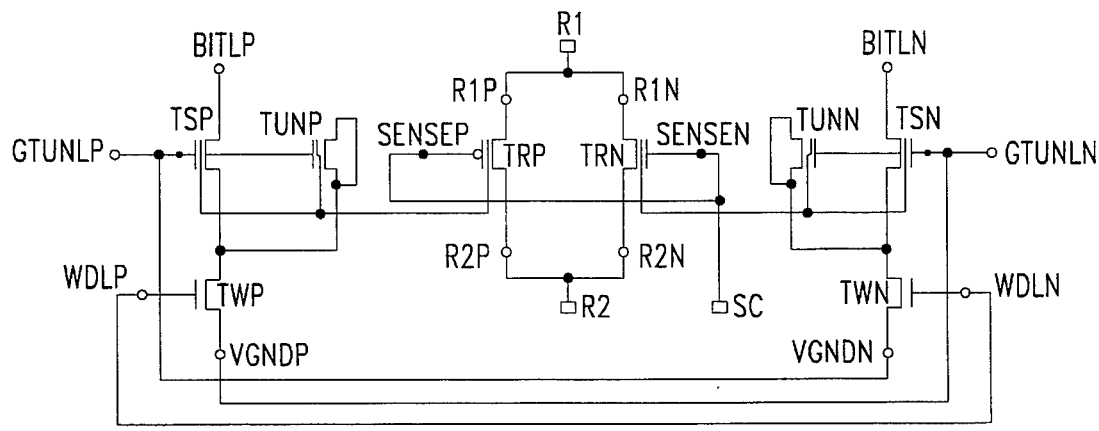
*Fig. 1*
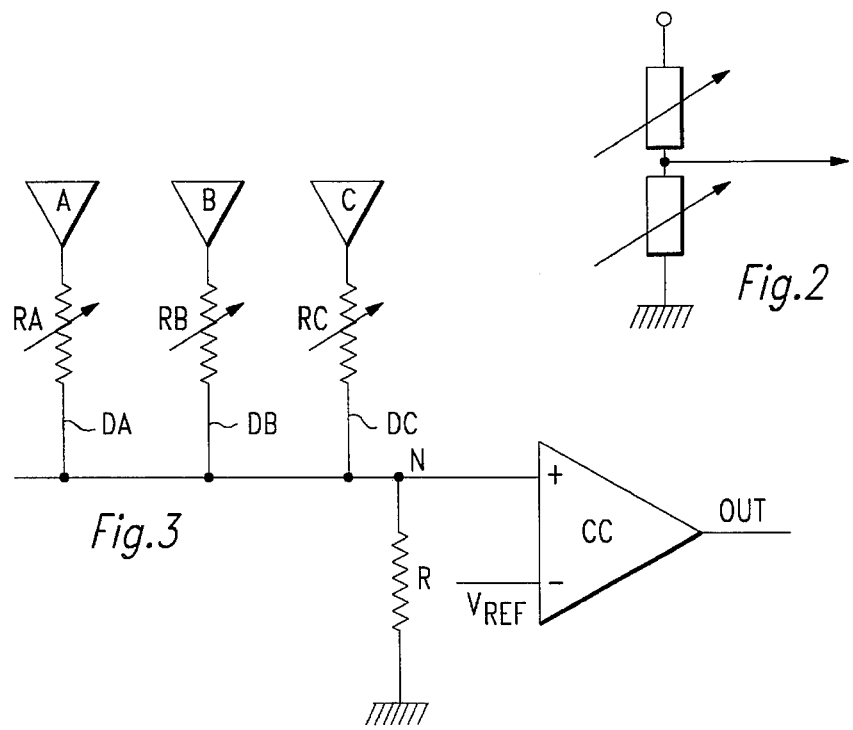
*Fig. 3*
*Fig. 2*

INTEGRATED CIRCUIT WITH NON-VOLATILE, VARIABLE RESISTOR, FOR USE IN NEURONIC NETWORK

This invention broadly relates to electronic circuits known as so-called neuronic networks in view of their operational similarity to the tridimensional physiologic structures of the cerebral neurons. More particularly, the invention concerns an integrated circuit having a non-volatile variable resistor for use in neuronic networks.

As is known, studies carried out on the brain have ascertained that the neuronal cells are arranged in a complex tridimensional array and interact with each other through particular regions known under the name of synapses. The transfer of a nervous stimulus from a neuron to another one is carried out through said synapses. The process by which a neuronic cell is stimulated by another neuronic cell and then the possibility to transfer the nervous stimulus from the one to the other cell are determined at the synapse level. The synapse network between the neuronic cells is tridimensional and very complex and is developed based upon the so-called dendrites: the dendrites are short, variously branched, cytoplasmatic extensions, by means of which a neuron contacts other neurons for transmission of nervous pulses.

It is very important to realize that, when a nervous pulse reaches a synapse, it will be effective to stimulate a second cell only if its strength is higher than a threshold limit value.

A second important realization is that, also in view of the complexity of the interactions, the threshold value enabling the transfer of a pulse through a synapse is additive, in the sense that it is the result of a plurality of components which reach the concerned synapse through the complex interactions.

A third and important realization is that the action exerted by a neuronic cell upon a certain synapse and therefore the contributory effects exerted upon a certain synapse are weighted.

Along the current technological development course, the need has arisen and the possibility has been investigated to design networks operating according to the three above discussed realizations and thus defined as neuronic networks.

A neuronic network, therefore, would be comprised of a plurality of mutually interacting nuclei in such a manner that:

a) a nucleus would be effected only when the sum of the effects exerted by all other nuclei interacting therewith is higher than a predetermined threshold level, which entails that:

b) the effects of the nuclei should be summable or additive; and c) each nucleus should operate with a predetermined weight, which means that their actions or effects should be weighted: and, as a consequent but necessary feature, d) the weight with which each nucleus acts should be constant or, which is better, it should be variable, meaning that it could be changed, but, on the other hand, it should be constant, meaning that it should not subject to undesired or uncontrolled variations.

A possible network capable of working as a neuronic network is shown in FIG. 3, and includes three nuclei A, B, C corresponding to three neurons connected to node N, which can be considered as a synapse, operating as an input node for comparator CC, to the other input of which a reference voltage Vref is connected. Neurons A, B, C, merge in node N by means of connections DA, DB, DC that can be considered as dendrites and each including a variable resistor RA, RB, RC. The neuronic currents flowing together into node N additively generate a voltage through resistor R. When the voltage established on node N is higher than the threshold value of comparator CC and assuming that comparator CC is implemented as a one-shot circuit, an output pulse will be generated therefrom.

The currents exiting from "neurons" A, B, C, can be varied and therefore can be weighted by adjusting variable resistors RA, RB, RC and these adjustments remain constant or stable until an external action is exerted thereupon.

Starting from a neuronic network as heretofore described, it is a specific object of this invention to provide an electronic integrated circuit structure adapted to perform the functions of the resistors RA, RB and RC, the values of which are variable but at the same time constant or non-volatile, in the above outlined sense.

This object is achieved according to the invention in principle and substantially by means of an integrated circuit structure comprising a floating gate MOS transistor and an EEPROM memory cell made of MOS transistors and comprising a read MOS transistor and a tunnel effect MOS element acting as a charge injecting member, the floating gates of all transistors and of the tunnel effect element being connected together, and the end pins of the resistor being connected to the source and drain regions of the floating gate MOS transistor.

According to the preferred and effective embodiment, the integrated circuit structure in effect includes the parallel combination of a first P-channel MOS transistor and a second N-channel MOS transistor, both having a floating gate and having two EEPROM memory cells made of N-channel MOS transistors respectively associated with respect thereto. The MOS transistors of each EEPROM memory cell include a read MOS transistor and a tunnel effect MOS element acting as a charge injecting member, having floating gates respectively connected to the floating gates of said P-channel and N-channel MOS transistors, respectively, as well as a selection MOS transistor, wherein the gate region of the read transistor of the EEPROM memory cell associated with said N-channel MOS transistor is connected to the virtual ground of the selection transistor of the EEPROM memory cell associated with said P-channel MOS transistor and the gate region of the read transistor of the EEPROM memory cell associated with said P-channel MOS transistor is connected to the virtual ground of the selection transistor of the EEPROM memory cell associated with said N-channel MOS transistor, the output of said variable resistor being picked up from the interconnected source and drain regions of the P-channel and N-channel MOS transistors.

Furthermore, in the preferred embodiment, the gate regions of said P-channel and N-channel MOS transistors are connected together and the integrated circuit structure has five pins, two pins corresponding to the interconnected source and drain regions of said P-channel and N-channel MOS transistors in order to pick-up the variable resistance value; one pin corresponding to the interconnected gate regions of said P-channel and N-channel MOS transistors; and two pins corresponding to the gate regions of the read MOS transistors of the two EEPROM memory cells, respectively.

Also in the preferred embodiment, it is possible to provide for an arrangement wherein the integrated circuit has, in addition to the above said five pins, two access pins corresponding to the gate regions of the selection transistors of the two EEPROM memory cells, respectively.

An advantageous feature of this invention is that a variable resistor comprising MOS transistors, with N-channel as well as with P-channel can be achieved with an EEPROM memory cell of the N-channel type in an integrated circuit structure.

Further details and advantages of this invention will be evident from the following description with reference to the accompanying drawings wherein the preferred embodiment is shown for illustrative and not for restrictive purposes.

In the drawings:

FIG. 1 shows a circuit diagram of an integrated circuit having a non-volatile variable resistor included as a part thereof according to this invention;

FIG. 2 shows an operative schematic view of two non-volatile variable resistors according to this invention designed so as to achieve a better division of the variation range;

FIG. 3 shows an ideal schematic view of an electronic neuronic network.

Referring to FIG. 3, it has been shown that a network designed as the one represented therein performs as a neuronic network and fulfills all of the above quoted requirements. Such a network, however, cannot be effectively manufactured so as to fulfill the convenience, cost and compactness requirements, in the first place because resistors RA, RB, RC which fulfill such requirements cannot be manufactured.

It is an object of this invention to provide an integrated circuit having a non-volatile variable resistor included as a component thereof and used in a manner corresponding to the effect of the above resistors RA, RB, RC.

The present invention is based upon a consideration of the behavior of an insulated floating gate MOS transistor. In fact, it is known that the effect of the variation of the charges injected into the floating gate region of an MOS transistor (positive or negative charges according to the transistor type) is to vary the conduction threshold of the transistor; in view of this, if the voltage is constant, the output current is varied.

In effect, it has been found that, if the charge amount and the charging times of the floating gate region are varied, different threshold values can be achieved, so that, when the read voltage is constant, different current values are achieved.

In other words, a floating gate MOS transistor is adapted to act as a variable resistor, when the effect of the variation of the charges injected into its floating gate is exploited.

Starting from this consideration and taking into account the requirement to maintain the adjustment of the resistance achieved by this approach constant and stable, this invention provides for interrelating with a floating gate MOS transistor, an EEPROM memory cell effective to act: as a charge injector into the floating gate MOS transistor; a storage element for the established condition; and a refresh or reset member to refresh or reset such condition against its time dependent degradation.

Up to now the MOS transistor has been used in memories mainly in the ON-OFF mode, meaning that the transistor was made conductive, so that a current flow was sensed in the reading phase, or it was made non-conductive or very scarcely conductive (very high threshold) so that no current flow was sensed in the reading phase of the memory.

A further consideration upon which this invention is based relates to the fact that the V/I characteristic of an MOS transistor is a curve with a downwardly directed concavity in a P-channel transistor and an upwardly directed concavity in an N-channel transistor. Therefore, when a parallel combination including a P-MOS transistor and an N-MOS transistor is used and said parallel combination is driven by the same voltage, a resultant transfer characteristic line is obtained which has a tendency to be curvature-compensated and linearized.

Therefore, the combination of a pair of MOS transistors, with P-channel and N-channel, respectively, is adapted to fulfill all of the above outlined requirements, inclusive of the maintainment and storage requirements of the adjusted resistance values. The storage function is connected with the fact that the variation of the charge level of the floating gate region, which is achieved by injection of charges therein, is inherently non-volatile, which amounts to saying that the charges (electrons or holes) received by the floating gate region are trapped therein, with no possibility of escape, at least from a theoretical (but substantially also from a practical) view point.

The device proposed by this invention should be iterative, under which term it should be understood that it should be effective to take various adjustments (different weights) before reaching its stable condition. The EEPROM memory cell is effective not only to enable this iterative process but also to solve the refresh (or reset) problem of the charges injected into the floating gate region, the degradation time of which, even if long, is not infinite.

The preferred circuit implementation of the device is shown in FIG. 1 wherein the parallel combination of two MOS transistors, TRP and TRN, with P-channel and N-channel, respectively, is shown; the threshold voltages Vt of these transistors can be independently adjusted by varying the charge level injected in their related floating gate regions.

Transistors TWP, TSP and TUNP form an EEPROM memory cell. The floating gate regions of transistors TSP and TUNP are connected to the floating gate region of transistor TRP (in integrated implementation, such floating gate regions are effectively formed by a single body of polysilicon). Transistor TUNP acts in effect as a charge injecting member with respect to the floating gate region of transistor TRP.

The gate regions of the two transistors TSP and TUNP are connected to a fixed voltage, but such a voltage can be varied for calibration or subdivision purposes, thereby achieving a trimming effect or a second degree of variability.

For symmetry reasons, transistors TWN and TSN and the injector transistor TUNN comprise a further EEPROM memory cell, with the transistors TSN and TUNN having respective floating gate regions connected to the floating gate region of N-channel transistor TRN.

As described above, a variation of the charge level in the floating gate region of the MOS transistor TRP or TRN, which is achieved by programming the related EEPROM memory cell, will result in a variation of the threshold voltage of the associated transistor and, as a consequence thereof, in a variation of its transconductance, when the bias conditions are established. This effect can be achieved separately both for transistor TRP and for transistor TRN, in view of the fact that each of them has its own floating gate region connected to a separate EEPROM memory cell. The transconductance value achieved by the above disclosed method is stored in a non-volatile manner in the insulated or floating gate regions of the two concerned transistors.

By controlling the amplitude and the duration of the programming voltage (pulse Vpp) during the programming phase of the EEPROM memory cells, it is possible to continuously vary the threshold voltages of both transistors and as a consequence the resistance between nodes R1N and R2N and similarly the resistance between nodes R1P and R2P.

In principle, each single symmetric structure behaves per se as a non-volatile variable resistor, but it is apparent that a more linear transfer function can be obtained by means of a parallel combination of two similar structures. In this combination, the ends of the resulting non-volatile resistor are R1 and R2. When transistors TRP and TRN are connected in parallel, any resistance variation can be achieved by varying in opposite directions the charge levels of the floating gates of the two transistors.

Aiming at this object, the control gate GTUNLN of the EEPROM memory cell associated with transistor TRN should be connected to the virtual ground VGNDP of the EEPROM memory cell associated with transistor TRP and, vice versa, the control gate GTUNLP of the EEPROM memory cell associated with transistor TRP should be connected to the virtual ground VGNDN of the EEPROM memory cell associated with transistor TRN.

A further possibility for modifying the resistance value between nodes R1 and R2 is to vary also the drive signals SENSEP and SENSEN for the gate regions of the two transistors TRP and TRN through pin SC (sense control) and to store this control voltage by means of a similar non-volatile structure, by arranging for a combination of two variable non-volatile resistors according to this invention, as shown in FIG. 2. In effect, such a combination enables a further degree of freedom to be obtained in controlling the value of the resistor.

A further solution to increase the resolution of the resistor according to the invention consists in serially connecting two or more variable non-volatile resistors provided with different weights (e.g. in a ratio 1:10). In this manner, if for instance it is possible to have ten subdivisions of the values of the resistors and if the two resistors are in a ratio 1:10, then the serial combined resistor will have its variation range subdivided into 100 values.

Summarizing, the device in effect will have five pins: two pins at the ends of the resistors per se, two pins to program the EEPROM memory cells and a pin for trimming/discretization purposes (SC). It is possible to provide for two more control pins connected to the gate regions of the transistors to select the two memory cells.

The preferred embodiments of this invention have been therefore described together with some applications thereof. It should be clearly understood, however, that those skilled in the art can make changes and modifications without departing from the scope of this invention.

We claim:

1. An integrated circuit for providing a non-volatile variable resistor for use in a neuronic network, said integrated circuit comprising:

a resistor-implementing MOS transistor having source and drain regions disposed in spaced relationship with respect to each other and being of a first conductivity type, a channel region of a second conductivity type interposed between the source and drain regions, a floating gate disposed above said channel region and insulated therefrom, and a control gate disposed above and insulated from said floating gate;

an EEPROM memory cell operably connected to said resistor-implementing MOS transistor and including a read MOS transistor having source and drain regions disposed in spaced relationship with respect to each other and being of the same conductivity type, a channel region of an opposite conductivity type interposed between the source and drain regions, a floating gate disposed above said channel region and insulated therefrom, and a control gate disposed above and insulated from said floating gate, and a tunnel-effect charge injection MOS element including a charge-injection MOS transistor having source and drain regions disposed in spaced relationship with respect to each other and being of the same conductivity type, a channel region of the opposite conductivity type interposed between the source and drain regions, a floating gate disposed above said channel region and insulated therefrom, a control gate disposed above and insulated from said floating gate, and means electrically connecting the source and drain regions of said charge-injection MOS transistor together;

means electrically connecting the floating gates of said resistor-implementing MOS transistor, said read MOS transistor, and said tunnel-effect charge injection MOS element in parallel;

a pair of conductors respectively connected to the source and drain regions of said resistor-implementing MOS transistor and extending therefrom to provide first and second terminals at the ends thereof; and said first and second terminals at the ends of said pair of conductors defining the opposite ends of the non-volatile variable resistor suitable for use in a neuronic network.

2. An integrated circuit according to claim 1, wherein said floating gate regions are formed by a single piece of polysilicon.

3. An integrated circuit for providing a non-volatile variable resistor for use in a neuronic network, said integrated circuit comprising:

a P-channel MOS transistor having source and drain regions disposed in spaced relationship with respect to each other and being of P-type conductivity, a channel region of N-type conductivity interposed between the source and drain regions, a floating gate disposed above said channel region and insulated therefrom, and a control gate disposed above and insulated from said floating gate;

an N-channel MOS transistor having source and drain regions disposed in spaced relationship with respect to each other and being of N-type conductivity, a channel region of P-type conductivity interposed between the source and drain regions, a floating gate disposed above said channel region and insulated therefrom, and a control gate disposed above and insulated from said floating gate;

means electrically connecting said P-channel MOS transistor and said N-channel MOS transistor in parallel, said P-channel MOS transistor and said N-channel MOS transistor being resistor-implementing MOS transistors;

a pair of EEPROM memory cells respectively made of N-channel MOS transistors and respectively operably connected to said resistor-implementing P-channel MOS transistor and to said resistor-implementing N-channel MOS transistor, each of said EEPROM memory cells including a read MOS transistor having source and drain regions disposed in spaced relationship with respect to each other and being of N-type conductivity, a channel region of P-type conductivity interposed between the source and drain regions, a floating gate disposed above said channel region and insulated therefrom, and a control gate disposed above and insulated from said floating gate, and a tunnel-effect charge injection N-channel MOS element including a charge-injection N-channel MOS transistor having source and drain regions disposed in spaced relationship with respect to each other and being of N-type conductivity, a channel region of P-type conductivity interposed between the source and drain regions, a floating gate disposed above said channel region and insulated therefrom, a control gate disposed above and insulated from said floating gate, and means electrically connecting the source and drain regions of said charge-injection N-channel MOS transistor together;

first means electrically connecting the floating gates of said resistor-implementing P-channel MOS transistor, said read N-channel MOS transistor, and said tunnel-effect charge injection N-channel MOS element of one of said pair of EEPROM memory cells in parallel;

second means electrically connecting the floating gates of said resistor-implementing N-channel MOS transistor, said read N-channel MOS transistor, and said tunnel-effect charge injection N-channel MOS element of the other EEPROM memory cell in parallel;

each of said pair of EEPROM memory cells further including a selection N-channel MOS transistor having source and drain regions disposed in spaced relationship with respect to each other and being of N-type conductivity, a channel region of P-type conductivity interposed between the source and drain regions, and a gate electrode disposed above said channel region and insulated therefrom;

virtual ground terminals for each of said selection N-channel MOS transistors of said pair of EEPROM memory cells, one of said source and drain regions of each of said selection N-channel MOS transistors being connected to the virtual ground terminal corresponding thereto;

the control gate of said read N-channel MOS transistor of the EEPROM memory cell connected to said resistor-implementing N-channel MOS transistor being connected to the virtual ground terminal of the selection N-channel MOS transistor of the EEPROM memory cell connected to said resistor-implementing P-channel MOS transistor, and the control gate of said read N-channel MOS transistor of the EEPROM memory cell connected to said resistor-implementing P-channel MOS transistor being connected to the virtual ground terminal of the selection N-channel MOS transistor of the EEPROM memory cell connected to said resistor-implementing N-channel MOS transistor;

first and second pairs of conductors, said first pair of conductors being respectively connected to the source regions of said resistor-implementing P-channel MOS transistor and said resistor-implementing N-channel MOS transistor and extending therefrom;

said second pair of conductors being respectively connected to the drain regions of said resistor-implementing P-channel MOS transistor and said resistor-implementing N-channel MOS transistor and extending therefrom; and said first and second pairs of conductors being respectively interconnected to provide first and second terminals defining the opposite ends of the non-volatile variable resistor suitable for use in a neuronic network.

4. An integrated circuit according to claim 3, wherein the control gates of said resistor-implementing P-channel MOS transistor and said resistor-implementing N-channel MOS transistor are interconnected.

5. An integrated circuit according to claim 4, including five pins: two pins corresponding to the first and second terminals provided by the interconnected first and second pairs of conductors respectfully connected to the source and drain regions of said resistor-implementing P-channel MOS transistor and said resistor-implementing N-channel MOS transistor for picking up the variable resistance value; a pin corresponding to the interconnected control gates of said resistor-implementing P-channel MOS transistor and said resistor-implementing N-channel MOS transistor; and two pins corresponding to the control gates of said read MOS transistors of the pair of EEPROM memory cells, respectively.

6. An integrated circuit according to claim 5, further including in addition to said five pins, two more access pins corresponding to the gate electrodes of the selection transistors of said pair of EEPROM memory cells, respectively.

7. A neuronic network comprising:

a non-volatile variable resistor;

a comparator having first and second inputs, the first input of said comparator being connected to said non-volatile variable resistor;

a reference voltage connected to the second input of said comparator;

a node interposed in the connection between the first input of said comparator and said non-volatile variable resistor; and a control resistor connected at one end thereof to said node between said first input of said comparator and said non-volatile variable resistor and at the other end to ground;

said non-volatile variable resistor being provided by an integrated circuit comprising:

resistor-implementing P-channel and N-channel MOS transistors, each having source and drain regions disposed in spaced relationship with respect to each other, a channel region interposed between the source and drain regions, a floating gate disposed above said channel region and insulated therefrom, and a control gate disposed above and insulated from said floating gate;

the source and drain regions of said resistor-implementing P-channel MOS transistor being of P-type conductivity and the channel region being of N-type conductivity;

the source and drain regions of said resistor-implementing N-channel MOS transistor being of N-type conductivity and the channel region being of P-type conductivity;

means electrically connecting said resistor-implementing P-channel MOS transistor and said resistor-implementing N-channel MOS transistor in parallel;

a pair of EEPROM memory cells respectively operably connected to said resistor-implementing P-channel MOS transistor and to said resistor-implementing N-channel MOS transistor, each of said EEPROM memory cells including a read MOS transistor having source and drain regions disposed in spaced relationship with respect to each other and being of the same conductivity type, a channel region of the opposite conductivity type interposed between the source and drain regions, a floating gate disposed above said channel region and insulated therefrom, and a control gate disposed above and insulated from said floating gate, and a tunnel-effect charge injection MOS element including a charge-injection MOS transistor having source and drain regions disposed in spaced relationship with respect to each other and being of the same conductivity type, a channel region of the opposite conductivity type interposed between the source and drain regions, a floating gate disposed above said channel region and insulated therefrom, a control gate disposed above and insulated from said floating gate, and means electrically connecting the source and drain regions of said charge-injection MOS transistor together;

first means electrically connecting the floating gates of said resistor-implementing P-channel MOS transistor, said read MOS transistor, and said tunnel-effect charge injection MOS element of one of said pair of EEPROM memory cells in parallel;

second means electrically connecting the floating gates of said resistor-implementing N-channel MOS transistor, said read MOS transistor, and said tunnel-effect charge injection MOS element of the other EEPROM memory cell in parallel;

each of said pair of EEPROM memory cells further including a selection MOS transistor having source and drain regions disposed in spaced relationship with respect to each other and being of the same conductivity type, a channel region of the opposite conductivity type interposed between the source and drain regions, and a gate electrode disposed above said channel region and insulated therefrom;

virtual ground terminals for each of said selection MOS transistors of said pair of EEPROM memory cells, one of said source and drain regions of each of said selection MOS transistors being connected to the virtual ground terminal corresponding thereto;

the control gate of said read MOS transistor of the EEPROM memory cell connected to said resistor-implementing N-channel MOS transistor being connected to the virtual ground terminal of the selection MOS transistor of the EEPROM memory cell connected to said resistor-implementing P-channel MOS transistor, and the control gate of said read MOS transistor of the EEPROM memory cell connected to said resistor-implementing P-channel MOS transistor being connected to the virtual ground terminal of the selection MOS transistor of the EEPROM memory cell connected to said resistor-implementing N-channel MOS transistor;

first and second pairs of conductors, said first pair of conductors being respectively connected to the source regions of said resistor-implementing P-channel MOS transistor and said resistor-implementing N-channel MOS transistor and extending therefrom; said second pair of conductors being respectively connected to the drain regions of said resistor-implementing P-channel MOS transistor and said resistor-implementing N-channel MOS transistor and extending therefrom; and said first and second pairs of conductors being respectively interconnected to provide first and second terminals defining the opposite ends of the non-volatile variable resistor.

8. A neuronic network comprising:

a non-volatile variable resistor;

a comparator having first and second inputs, the first input of said comparator being connected to said non-volatile variable resistor;

a reference voltage connected to the second input of said comparator;

a node interposed in the connection between the first input of said comparator and said non-volatile variable resistor; and a control resistor connected at one end thereof to said node between said first input of said comparator and said non-volatile variable resistor and at the other end to ground;

said non-volatile variable resistor being provided by an integrated circuit comprising:

a resistor-implementing MOS transistor having source and drain regions disposed in spaced relationship with respect to each other and being of a first conductivity type, a channel region of a second conductivity type interposed between the source and drain regions, a floating gate disposed above said channel region and insulated therefrom, and a control gate disposed above and insulated from said floating gate;

an EEPROM memory cell operably connected to said resistor-implementing MOS transistor and including a read MOS transistor having source and drain regions disposed in spaced relationship with respect to each other and being of the same conductivity type, a channel region of the opposite conductivity type interposed between the source and drain regions, a floating gate disposed above said channel region and insulated therefrom, and a control gate disposed above and insulated from said floating gate, and a tunnel-effect charge injection MOS element including a charge-injection MOS transistor having source and drain regions disposed in spaced relationship with respect to each other and being of the same conductivity type, a channel region of the opposite conductivity type interposed between the source and drain regions, a floating gate disposed above said channel region and insulated therefrom, a control gate disposed above and insulated from said floating gate, and means electrically connecting the source and drain regions of said charge-injection MOS transistor together;

means electrically connecting the floating gates of said resistor-implementing MOS transistor, said read MOS transistor, and said tunnel-effect charge injection MOS element in parallel;

a pair of conductors respectively connected to the source and drain regions of said resistor-implementing MOS transistor and extending therefrom to provide first and second terminals at the ends thereof; and said first and second terminals at the ends of said pair of conductors defining the opposite ends of the non-volatile variable resistor.

9. An integrated circuit for providing a non-volatile variable resistor for use in a neuronic network, said integrated circuit comprising:

resistor-implementing P-channel and N-channel MOS transistors having source and drain regions disposed in spaced relationship with respect to each other, a channel region interposed between the source and drain regions, a floating gate disposed above said channel region and insulated therefrom, and a control gate disposed above and insulated from said floating gate;

the source and drain regions of said resistor-implementing

P-channel MOS transistor being of P-type conductivity and the channel region being of N-type conductivity;

the source and drain regions of said resistor-implementing N-channel MOS transistor being of N-type conductivity and the channel region being of P-type conductivity;

means electrically connecting said resistor-implementing P-channel MOS transistor and said resistor-implementing N-channel MOS transistor in parallel;

a pair of EEPROM memory cells respectively operably connected to said resistor-implementing P-channel MOS transistor and to said resistor-implementing N-channel MOS transistor, each of said EEPROM memory cells including a read MOS transistor having source and drain regions disposed in spaced relationship with respect to each other and being of the same conductivity type, a channel region of an opposite conductivity type interposed between the source and drain regions, a floating gate disposed above said channel region and insulated therefrom, and a control gate disposed above and insulated from said floating gate, and a tunnel-effect charge injection MOS element including a charge-injection MOS transistor having source and drain regions disposed in spaced relationship with respect to each other and being of the same conductivity type, a channel region of the opposite conductivity type interposed between the source and drain regions, a floating gate disposed above said channel region and insulated therefrom, a control gate disposed above and insulated from said floating gate, and means electrically connecting the source and drain regions of said charge-injection MOS transistor together;

first means electrically connecting the floating gates of said resistor-implementing P-channel MOS transistor, said read MOS transistor, and said tunnel-effect charge injection MOS element of one of said pair of EEPROM memory cells in parallel;

second means electrically connecting the floating gates of said resistor-implementing N-channel MOS transistor, said read MOS transistor, and said tunnel-effect charge injection MOS element of the other EEPROM memory cell in parallel;

first and second pairs of conductors, said first pair of conductors being respectively connected to the source regions of said resistor-implementing P-channel MOS transistor and said resistor-implementing N-channel MOS transistor and extending therefrom;

said second pair of conductors being respectively connected to the drain regions of said resistor-implementing P-channel MOS transistor and said resistor-implementing N-channel MOS transistor and extending therefrom; and said first and second pairs of conductors being respectively interconnected to provide first and second terminals defining the opposite ends of the non-volatile variable resistor suitable for use in a neuronic network.

10. An integrated circuit as set forth in claim 9, wherein each of said pair of EEPROM memory cells further includes a selection MOS transistor having source and drain regions disposed in spaced relationship with respect to each other and being of the same conductivity type, a channel region of the opposite conductivity type interposed between the source and drain regions, and a gate electrode disposed above said channel region and insulated therefrom;

virtual ground terminals for each of said selection MOS transistors of said pair of EEPROM memory cells, one of said source and drain regions of each of said selection MOS transistors being connected to the virtual ground terminal corresponding thereto; and the control gate of said read MOS transistor of the EEPROM memory cell connected to said resistor-implementing N-channel MOS transistor being connected to the virtual ground terminal of the selection MOS transistor of the EEPROM memory cell connected to said resistor-implementing P-channel MOS transistor and the control gate of said read MOS transistor of the EEPROM memory cell connected to said resistor-implementing P-channel MOS transistor being connected to the virtual ground terminal of the selection MOS transistor of the EEPROM memory cell connected to said resistor-implementing N-channel MOS transistor.

* * * * *